United States Patent [19]

Corcoran et al.

[11] 4,325,025
[45] Apr. 13, 1982

[54] AUTOMATED CHANNEL DOPING MEASURING CIRCUIT

[75] Inventors: Richard A. Corcoran, Colchester; William A. Keenan, Montpelier; Demetrios Michaelides, South Burlington, all of Vt.; Bob H. Yun, Hopewell Jct., N.Y.

[73] Assignee: International Business Machines Corporation, Armonk, N.Y.

[21] Appl. No.: 152,226

[22] Filed: May 22, 1980

[51] Int. Cl.³ .................. G01R 31/26; G01R 27/26
[52] U.S. Cl. ......................... 324/158 R; 324/60 R; 324/158 T; 324/158 D
[58] Field of Search ........... 324/158 R, 158 D, 158 T, 324/60 R

[56] References Cited

U.S. PATENT DOCUMENTS 3,995,216  11/1976  Yun .............................. 324/158 D

OTHER PUBLICATIONS

Ziegler et al., "Determination of . . . ", Solid State Electronics, 1975, vol. 18, pp. 189–198.

*Primary Examiner*—Ernest F. Karlsen
*Attorney, Agent, or Firm*—Francis J. Thornton

[57] ABSTRACT

An apparatus for measuring the surface potential and impurity concentration in a semi-conductor body by monitoring the current flowing in a semiconductor body when the body is biased with a ramp voltage above its flat band voltage and summing the monitored current with the ramp voltage biasing the body. The apparatus provides direct measurement of surface potential and impurity concentration in a semiconductor structure and is especially useful in metal insulator semiconductor (MIS) structures.

7 Claims, 4 Drawing Figures

AUTOMATED CHANNEL DOPING MEASURING CIRCUIT

BACKGROUND OF THE INVENTION

1. Field of the Invention

This invention relates generally to an apparatus for measuring the impurity or dopant concentration in a semiconductor body and more particularly to an apparatus and technique for measuring the surface potential and impurity concentration in the depleted region created under a biased, insulated, electrode placed over the body.

2. Description of the Prior Art

U.S. Pat. No. 3,840,809, assigned to the same assignee as the present invention, is directed towards an apparatus and method for measuring the properties of dielectric materials by measuring simultaneously the amount of charge injected into the dielectric and the voltage required to restore the surface potential to its original state.

U.S. Pat. No. 3,995,216, assigned to the same assignee as the present invention, describes an apparatus and method of measuring the surface state charges in a metal insulator semiconductor structure by measuring simultaneously and directly the amount of charge injected into the insulator, the net change in the semiconductor body and its surface and the change in surface potential of the semiconductor body.

U.S. Pat. No. 3,668,523 teaches the testing of the properties of dielectric layers which exhibit a voltage dependent capacitance.

IBM Technical Disclosure Bulletin, Vol. 19, #8, January 1977, on pages 3091 and 3092, describes a technique for measuring doping concentration of a semiconductor.

IBM Technical Disclosure Bulletin, Vol. 19, #12, May 1976, on pages 4226–4228, teaches that the impurity concentration of a semiconductor can be inspected.

None of the above prior art references however teach or disclose that under non-equilibrium conditions, the surface potential and impurity or doping concentration in the semiconductor body can be rapidly and directly measured.

SUMMARY OF THE INVENTION

Broadly speaking the present invention describes an automated doping measuring circuit which provides a direct measurement of surface potential and impurity concentration in a semiconductor body.

The apparatus can be utilized for measuring the substrate doping concentration of a semiconductor.

The apparatus can be particularly used to measure the impurity concentration in the depleted region created in a semiconductor body by biasing a body with respect to an overlying electrode.

The apparatus provides an extremely rapid and simple measurement not only of the surface potential but also the impurity concentration in a semiconductor body without creation of an actual field-effect device in the body.

The present invention particularly teaches an apparatus that provides a real time, in-line, process characterization of a field-effect transistor manufacturing line by merely utilizing capacitive action between a metallic electrode overlying and insulated from the semiconductor body whose dopant concentration is to be measured and in which the field-effect transistors are to be created.

In summary, the present invention is an apparatus for applying a ramped voltage in excess of the measured flat band voltage of the semiconductor body, to an insulated electrode on a semiconductor body being measured, monitoring the induced current in the body and summing it with the ramped voltage for measuring the surface potential of the body and determining the dopant concentration in the depletion region induced within the semiconductor body.

DESCRIPTION OF THE DRAWINGS

These and other features, advantages and objects of the present invention will be more fully appreciated from the following detailed description of a preferred embodiment of the invention taking in conjunction with the accompanying drawings.

DESCRIPTION OF THE PREFERRED EMBODIMENT

Figure 1:
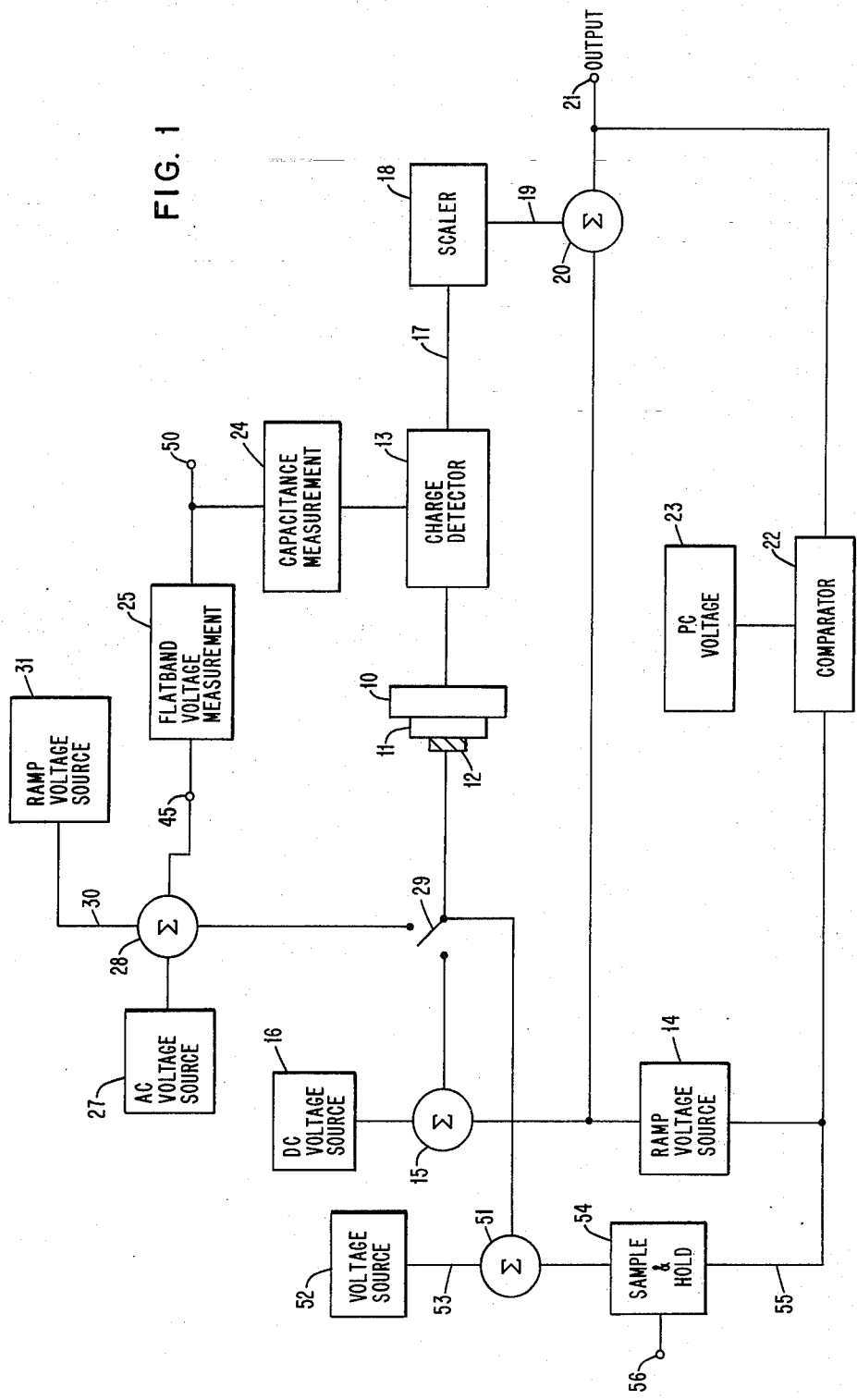
FIG. 1 illustrates, in functional block form, a complete system employing the present invention.

Referring now to the drawings, an apparatus employing the present invention will be described in detail as to its construction and operations.

Semiconductor devices having insulated metallic electrodes on their surface have traditionally been processed using ion implantation to enhance the induced channel region created when the electrode on the surface is properly biased. These devices are traditionally known as MIS device, i.e., metal-insulator-semiconductor and their processing has traditionally been monitored using capacitance voltage techniques to measure both fixed charge and mobile charge in the insulator, usually silicon oxide.

In such processing it was always assumed that the channel doping was the starting wafer impurity concentration plus the impurities actually introduced by subsequent ion implantation techniques.

In fact, however, the effects of both hot processing and the varying chemical treatments and oxidations during the processing and creation of the device will also introduce impurities into the semiconductor body and all of these treatments will alter the net channel doping, either reducing it or increasing it.

Thus, devices so built have only an approximate channel doping and their characteristics will vary from device to device or wafer to wafer depending upon the exact process to which each has been subjected. Until the present invention, the exact doping in a semiconductor body has been unmeasurable and all treatments to compensate for such processes by subsequent ion implantation has at best been approximate.

The capacitance voltage techniques presently known and used cannot begin to measure the actual channel doping of treated semiconductor bodies since they average the concentration of the doping over a depth of between 5,000 and 10,000 angstroms and in most field-effect transistors the gate induced channel region is usually 1,000 angstroms or less.

A semiconductor body 10 whose dopant concentration is to be measured is provided with a dielectric or insulating layer 11, such as silicon dioxide, and a metal electrode 12, such as aluminum, over the layer 11 to form a so-called MIS (metal-insulator-semiconductor) structure. The body 10 is coupled to a charge detection circuit 13 capable of measuring the amount of current flowing out of the body when a ramped voltage, from a ramped voltage source 14, is summed, by summer 15, with the measured flat band voltage of the body and is impressed on the electrode 12. DC source 16 supplies to electrode 12 a voltage equal to the measured flat band voltage. The impressment of these summed voltages causes an expanding depletion region to be created in the body 10 and current to flow out of the body 10. This current is a function of the type and number of dopant impurities in the body as well as the surface potential of the body.

The output 17 of the detection circuit 13 is acted on by a scaler circuit 18 so that its output 19 is a voltage directly porportional to the charge uncovered in the depletion region, created in the body 10 by the applied voltages, and inversely porportional to the capacitance of the dielectric layer 11. This output 19 is now fed to a summing circuit 20 where it is summed with the ramped voltage from source 14. The output 21 of this summing circuit 20 is a voltage determinitive of the surface potential of the device under test.

This output may be fed back through a comparator circuit 22 so that the ramp voltage source 14 may be cut off when the surface potential reaches a predetermined level set by voltage source 23.

Once the amount of charge uncovered in the silicon body 10 and the surface potential of the body have both been determined, the impurity concentration, that is the actual number of dopants per cubic centimeter in the created depletion region, can be established as will be explained in detail below.

Also coupled to the charge detection circuit 13 is a capacitance measurement circuit 24 and a flat band measurement circuit 25. To measure the flat band voltage of the device 10 under test it is necessary that a ramped DC signal from ramp voltage source 31 be summed with a superimposed AC voltage signal from an AC voltage source 27 and be selectively applied to the electrode 12 through a switch 29.

When the thickness of the dielectric 11 is 1,000 angstroms or less and the body 10 is a semiconductor body, say of silicon, the ramp voltage source 31 should be capable of supplying voltages from −30 to +30 volts over a time period of a few seconds. Of course other sources having voltages and durations of greater or lesser value will be used with different thicknesses or materials are used. The AC voltage source 27 in the particular embodiment described here preferably has a 100 kilohertz output ±20 mv ac. Sources of other appropriate frequencies and amplitudes can of course be used.

Figure 2:
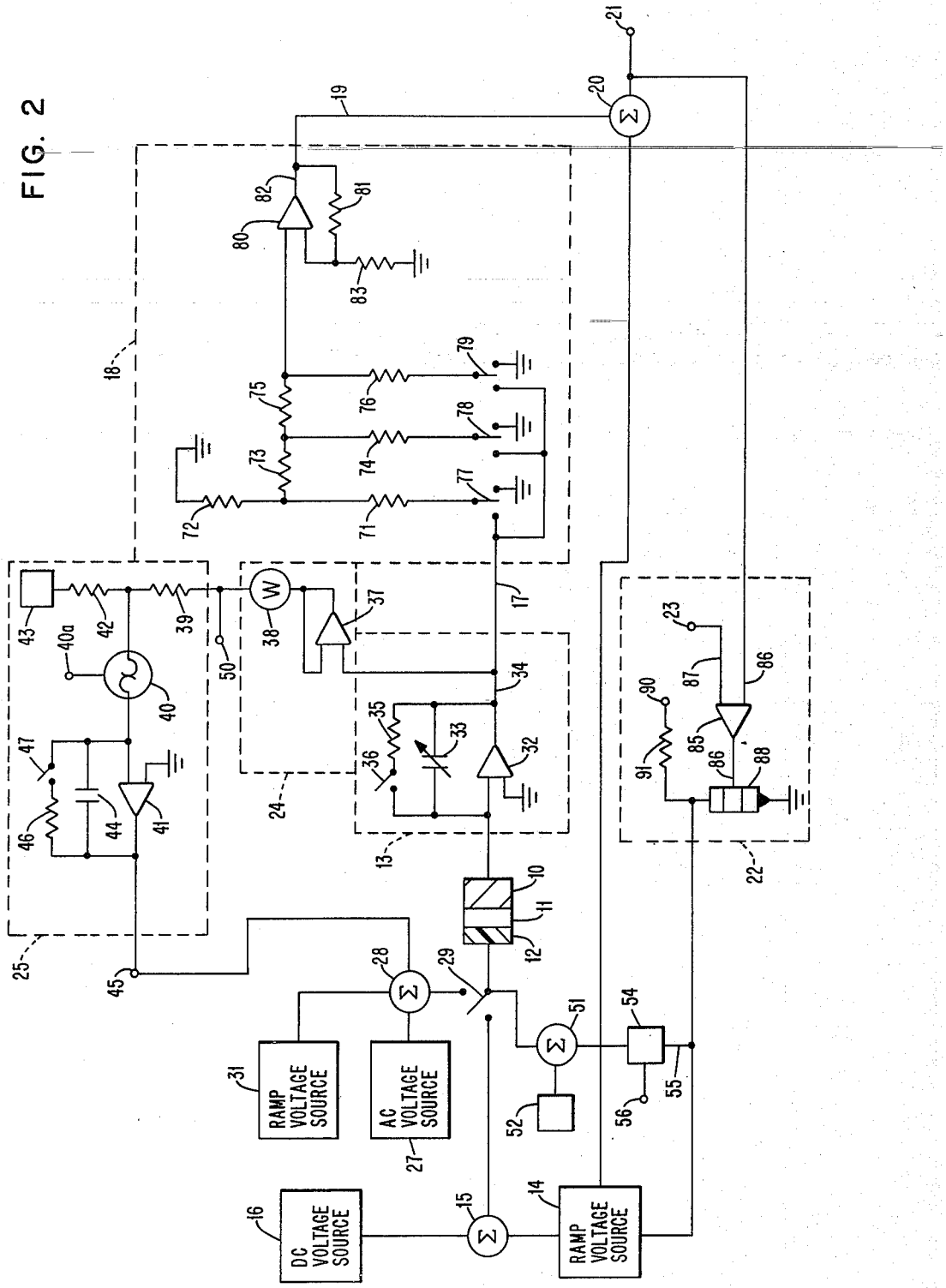
FIG. 2 illustrates in schematic form a complete system of the invention.
Figure 4:
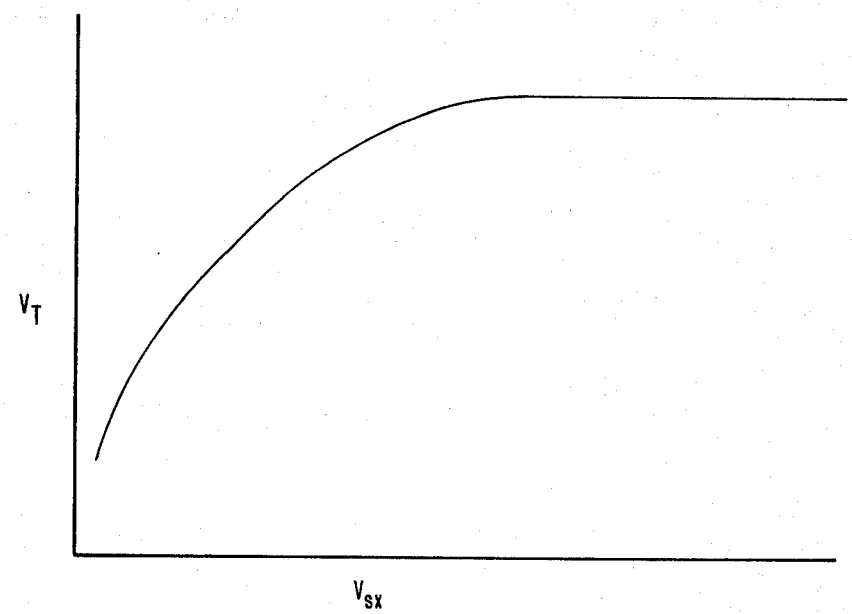
FIG. 4 is a plot of the measured threshold voltage versus the substrate bias voltage.
Figure 3:
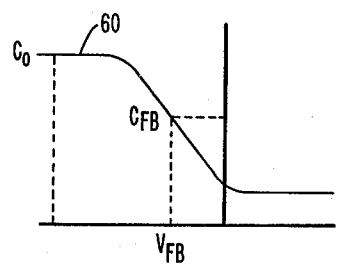
FIG. 3 illustrates the capacitance voltage plot of the device under test.

Referring now to FIGS. 2 to 4 the invention will be explained in greater detail.

As stated above it is necessary to establish the capacitance of the device dielectric 11 and the flat band voltage of the device 10 under test. Although there are several techniques available to measure capacitance of the device dielectric 11 and the flat band voltage of the device 10 it is preferable that they be measured in the same apparatus which measures the other characteristic of the device. This assures minimal handling of the device and also assures that the capacitance of the dielectric 11 and the flat band voltage are both accurately measured immediately before the measurement of the desired surface potential.

To measure the capacitance of the device dielectric 11 and the flat band voltage of the device 10 and the electrode 12 on the dielectric 11 is coupled to summing circuit 28 by setting switch 29 to connect the electrode 12 to summing circuit 28. This setting of switch 29 disconnects the summing circuit 15, to which is coupled voltage sources 14 and 16. Into the summing circuit 28 there is now coupled a signal from the AC source 27 and a signal from the ramp voltage source 31.

The body 10 is coupled to the negative input of an operational amplifier 32 which has a variable capacitor 33 connected between its negative input and its output 34. This capacitor 33 causes the amplifier 32 to integrate the current at the negative input, if a resistor 35, parallel to capacitor 33, is not connected to the input of amplifier 32 through switch 36. The output 34 is in turn connected through a buffer circuit 37 to a phase locking amplifier 38 whose output is connected through a resistor 39 and a pulsed switch 40 to the negative input of another operational amplifier 41 and through another resistor 42 to a voltage reference source 43. The operational amplifier 41 also has a capacitor 44 coupled between its negative input and its output 45. Also coupled across the amplifier 41, in parallel with the capacitor 44 is a resistor 46 and a switch 47. When switch 47 is in the open position amplifier 41 acts as an integrator.

The above described dielectric capacitance and flat band measuring circuits operate as follows.

A pristine MOS structure immediately after its construction is placed in the circuit and its capacitive voltage curve, commonly known as a CV plot is obtained. To accomplish this the switch 29 is set to couple summing circuit 28 to the electrode 12. Switch 40 is closed by applying a suitable voltage to node 40a and switches 36 and 47 are also closed. Closing of switch 36 prevents the amplifier 32 from saturating due to an excessive current. The resistor 35 in parallel to capacitor 33 is chosen such that their RC combination allows amplifier 32 to continue to act as an integrator at the frequency of source 27.

Closing of switch 47 keeps the output 45 of amplifier 41 at zero so that it will not interfere with the obtaining of this CV plot. The output of the ramp voltage source 31 varies, say from −30 volts to +30 volts. The application of this ramp voltage summed with the sinusoidal signal from the AC voltage source 27 to the electrode 12 causes a current to flow in the body 10. This current flow is detected at the negative input of the operational amplifier 32 which is directly coupled to the semiconductor body 10. The operational amplifier 32 by virtue of a negative feedback arrangement through the capacitor 33 serves to integrate the current flow detected at its input. The output 32 of the operational amplifier 32 thus provides a signal which is proportional to the integral of the current flow in the body 10. This output of amplifier 32 is now applied through the buffer amplifier 37 to the phase locking amplifier 38 whose output at node 50 is porportional to the RMS value of the response of the device to the AC signal applied thereto. Thus, the output of this phase locking amplifier 38 is a measurement of the capacitance of the structure. The output of this phase locking amplifier can, if necessary, be fed into a linearizing amplifier (not shown) whose output is say to equal 1 volt for each 100 pico farad of capacitance.

The output at node 50 of the amplifier 38 is a measurement of the capacitance of the structure and is plotted in FIG. 3 against the applied ramp voltage as curve 60. Both the flat band capacitor CFB and the maximum capacitance i.e., the capacitance of the oxide Co may be obtained from this curve. The capacitor 33 across amplifier 32 is now reset to exactly equal the capacitance Co of the structure.

As is well known in the semiconductor art the flat band capacitance generally is thus measured, i.e., a ramp voltage is applied to the device to get a high frequency CV plot as shown in FIG. 3 as curve 60. From this high frequency CV plot the point of maximum slope is located. This point is, by definition, the flat band capacitance and shown in FIG. 3 as the point where the line and the curve 60 intersect. This intersection is the flat band voltage $V_{fb}$.

Alternately one may choose to calculate the flat band capacitance CFB by a procedure described, for example, by S. M. Sze in "Physics of Semiconductor Devices" published by John Wiley and Sons Company, on page 432 and may measure flat band voltage by the technique described, for example, by A. Goetzberger in "Ideal MOS Curves for Silicon" which appeared in the Bell System technical journal 45,1097 (1966).

In an ideal structure, in which no charge has been trapped in the insulator during creation of the insulator or by previous electrical treatments and no surface states, the work function difference between the electrode and the semiconductor is equal to the flat band voltage. This work function difference between the electrode and the body is of course readily calculable since the work function of the respective materials are well known physical constants. However, since insulators may not be free of charges due either to the manufacturing techniques or because of previous testing during manufacture, the initial flat band voltage VFB originally measured, from curve 60 may not be equal to this work function difference. In FIG. 3, curve 60 illustrates such a case, i.e., where the initial flat band voltage VFB is not equal to the work function difference.

Now that the flat band voltage and dielectric capacitance of the device 10 have been determined the structure is now in a condition to have the surface potential and the quantity of dopant charge therein measured. This is accomplished in the following manner. Switch 29 is now made to disconnect the summing circuit 28 and the flat band measuring circuits from the electrode 12 and to connect the summing circuit 15 to the electrode 12. Switch 36 is closed across amplifier 32 and the voltage source 16 is now set to the measured flat band voltage of the device under test. The capacitor 33 is set at 100 pf.

The output of the charge detection circuit 13 is fed into a scaler circuit 18 via line 17. This circuit 18 is, as shown in FIG. 2, a well known switchable, ladder resistance circuit coupled to an amplifier. Specifically the scaler circuit comprises a plurality of resistors 71, 72, 73, 74, 75 and 76 coupled to switches 77, 78 and 79 and the positive input of an operational amplifier 80 whose negative input is coupled to its own output 82 through a resistor 81 and to ground through another resistor 83. Resistor 72 is coupled between ground and the junction of resistors 71 and 73. The other end of resistor 71 is connected to a switch 77 which can be connected either to the output 34 of the charge detector via line 17 or to ground. The other end of resistor 73 is connected to the junction of resistors 74 and 75.

Resistor 75 is connected in series between resistor 73 and the positive input of the amplifier 80. Resistor 74 is connected between the junction of resistor 73 and resistor 75 and has its other end connected to the switch 78 which can be connected either to the output 34 via line 17 of the charge detector circuit 17 or to ground. One end of resistor 76 is also coupled to the positive output of the amplifier 80 together with resistor 75, and its other end is connected to a switch 79. This switch 79 may be selectively coupled either to the output 34 of the operational amplifier 32 via line 17 or to ground. Ideally, the resistors 71, 72, 74 and 76 are twice the value of resistors 73 and 75 while the operational amplifier 80 has an amplification factor of 2.

Switches 77, 78 and 79 can be set to scale the output of the amplifier 32. Thus, for example, when switch 79 is coupled to the output line 17 the signal on line 19 is identical to the signal on line 17. When switch 78 is coupled to line 17 the signal on line 19 is one half the signal on line 17. When switch 77 is coupled to the line 17 the signal on line 19 is one quarter the signal on line 17. Although for purposes of this description only three set of switches are shown it is well known to be obvious that the scaler can have any number switches and resistors in series and each of them can be selectively set to scale the output of line 17 by any factorial desired. Once source 16 has been set to the flat band voltage, switch 36 is opened and the ramp voltage source 14 is started up beginning at zero volts. This ramp voltage source can be made to rise to any desired level but should not exceed approximately 1 volt per 10 angstroms of thickness of the insulator 11. The ramp rate should be approximately 1000 volts per second. As the ramp voltage increases it is summed with the flat band voltage from source 16 and causes the gate voltage applied to the electrode 12 to rise at the ramp rate above the flat band voltage. After scaling by the correct factor the output of the multiplier on line 19 is a direct function of the charge uncovered in the silicon in terms of coulombs and inversely a function of the capacitance Co, i.e., the capacitance of the device under test. Alternately capacitor 33 could be set to equal the value of the measured oxide capacitance. In such a case the scaling circuit could be deleted. The output which appears at line 19 is now fed into a summing circuit 20 together with the ramp voltage from the ramp voltage supply 14. The summing of these two signals provide an output signal at node 21 which is a direct measurement of the surface potential of the device under test in terms of volts and can be plotted against the applied gate voltage (i.e. ramp voltage plus flat band voltage). Thus any specified surface potential can be determined. In this case the monitoring circuit alleviates the necessity of obtaining the area of electrode 12 because it unitizes the area of the electrode and thus automatically removes it from the resultant measurement on line 19.

The described apparatus can be made fully automatic so as to hold the ramp voltage at the voltage at which the surface potential meets a preset level. This automation is achieved by feeding the signal at output 21 back through a comparator circuit 22. This comparator circuit has a preset DC voltage, from a voltage source 23, applied thereto such that when the signal on node 21 matches it the comparator circuit holds the ramp voltage source 14 at the level which cause the output at line 21 to equal the voltage set on source 23.

Comparator circuits are well known and may for example comprise an operational amplifier 85 having a positive input 86 connected to the output 21 and a negative input 87 connected to a DC voltage source 23 which is set to desired compare level. The output of this operational amplifier is fed to the base of 86 of a npn transistor 87 whose emitter 88 is coupled to ground and whose collector 89 is coupled to a fixed voltage node 90 through a resistor 91. When the voltage on node 21 matches the predetermined level set by source 23 the transistor 87 is turned on and a negative input voltage is applied to the ramp voltage source 14 causing it to hold its value.

In summary, scaler circuit 17 has its output connected to an output node 19 which is coupled to a summing circuit 20 to which there is also provided an input from the ramp voltage source 14. The output 21 of the summing circuit 20 is the surface potential of the device being measured. This output may be returned via comparator circuit 22 to the ramp voltage circuit 14 to selectively hold the ramp voltage source at the level where the surface potential being measured equals the preset surface potential desired in the device under test.

The following summarizes the operation of the apparatus and provides a simple mathematical analysis of the circuit operation. Initially both the flat band voltage and the oxide capacitance are measured. This may be accomplished with the flat band voltage measurement circuit 25 and the capacitance measuring circuit 24. Once these measurements are made the switch 29 is coupled to the summing circuit 15 and the DC voltage source 16 is set at equal to the measured flat band voltage. Simultaneously, the capacitance 33 of the integrating amplifier 32 is set equal to the measured capacitance of the dielectric 11 as measured at node 50 and switch 36 is opened. In this case the scaler circuit 18 can be deleted. If the capacitor 33 is a fixed value of say 100 pico farads the scaler circuit 18 is set equal to the ratio of the capacitor 33 and the capacitance of the oxide layer 11.

The ramp voltage source 14 is now started up at 0 volts and increases linerally with time. As the gate voltage begins to exceed the flat band voltage, applied to the gate by DC voltage source 16, a depletion region is created in the semi-conductor body 10. As the voltage applied to electrode 12 increases in excess of the preset DC voltage output of voltage source 16 the depletion region expands in the semiconductor body 10 and a current flows out of the body 10 into the charge detector 13. This current flows through the integrating circuit provides an output voltage at output 34 of the charge detection circuit 13 is equal to:

$$\frac{1}{C_{33}} \int_0^t I(t)\,dt.$$

where I is the current flowing out of the device 10. This output voltage is fed into the scaler circuit 17 preset so as to provide a scaling factor equal to the ratio of the measured dielectric capacitance to capacitor 33. The output of the scaler circuit will be equal to the inverse of the capacitance of the oxide layer times the integral of the current flow out of the device 10. Thus, the output of the scaler circuit 17 at line 19 is $V_s$ which equals $$V_s = \frac{1}{C_o} \int_0^t I(t)\,dt$$

or $$V_s = \frac{Q_s}{C_o}$$

where Co is the capacitance of the oxide layer 11.

Qs is the charge uncovered in the silicon in the terms of coulombs.

This output voltage is now summed with the output of the ramped voltage source 14 to give the surface potential of the body 10 at node 21. Thus $$V_g = V_r + V_{fb}$$

$$V_g = V_{fb} + \phi_s(-Q_s/C_o)$$

$$\phi_s = V_r + Q_s/C_o$$

where:
$V_g$ is the voltage applied to electrode 12,
$V_r$ is the applied ramp voltage,
$V_{fb}$ is the measured flat band voltage, and
$\phi_s$ is the surface potential The output at node 21 is thus the surface potential of the device under test and can be read or displayed by any appropriate voltage sensitive device such as a digital volt meter, a cathode ray storage tube or any XY recorder.

Since the charge uncovered in the silicon $$Q_s = qA \int_0^{xd} N(x)\,dx$$

where q is the electron charge, A is the area of electrode 12, N(x) is the number of dopant atoms per cc at a distance X in the body, where xd is the depth to which mobile charge is depleted in the body, and the surface potential $\phi_s$ is $$\frac{q}{E} \int_0^{xd} dx \int_x^{xd} N(x)'\,dx'$$

when E is the permittivity of silicon,

All the information required to monitor the channel doping of the device under test and to determine the number of dopants per cubic centimeter N(x) at a distance X in the body is thus now available from the measurement of the charge Qs uncovered in the body as a function of the surface potential $\phi$s. Since the center of mass of charge or charge centroid in the device is defined as $$\bar{X} = \frac{\int_0^\infty x\,p(X)dy}{\int_0^\infty p(x)dy}$$

where Px is the density of exposed charge in the body at the distance X. This can also be expressed in terms of the measured parameter.

$$\bar{X} = (\varepsilon_s \phi_s)/(Q_s/A)$$

Thus, the dopant contained within the distance $\overline{X}$ has now been characterized, extending from the distance $\overline{X}$ up to the surface of the silicon insulator interface.

The threshold voltage of the device 10 under test may also be measured.

Broadly defined the turn-on or threshold voltage of a field effect device is the gate voltage required to form a strong inversion layer of minority carriers equal in concentration to the bulk concentration of majority carriers. This condition can be defined in terms of a critical surface potential, or the amount of band bending in going from the bulk to the surface $$\phi = 2\phi_b = 2(kT/q)\ln(Na/ni)$$

where
  $\phi_b$ with separation between the fermi energy in the bulk and the mid gap energy
  K is Boltzmann's constant
  T is absolute temperature
  Na = average carrier concentration.

In the case of 13 ohm-cm p-type silicon which has a carrier concentration of $Na = 1.15 \times 10^{15}$ cm$^{-3}$ and an intrinsic carrier concentration $n_i = 1.41 \times 10^{10}$ cm$^{-3}$, $\phi = 0.588$ volts at room temperature. To accomplish this the measured surface potential at the output node 21 is compared in comparator 22 to a preset value of desired surface potential $\phi_{sd}$. When the two levels are equal the comparator circuit stops the ramp voltage and holds it at its instantaneous value. When this occurs (time to) the gate voltage $V_g$ applied to the electrode 12 by the ramp voltage source 14 is equal to that required to produce the preset desired surface potential $\phi_{sd}$ as set forth in the equations below.

$$V_G(to) = V_{FB} + V_R(to)$$

$$\phi_{sd}(to) = V_R(to) + (Qs/Co)(to)$$

$$V_G(to) = V_{FB} + \phi_{sd}(-Qs/Co)(to)$$

where
  $V_G$ = gate voltage
  to = time when ramp is held by comparator
  $V_R$ = ramp voltage applied by source 14
  $\phi_{sd}$ = preset value of desired surface potential In the case where the substrate bias is zero the desired surface potential is set equal to the device to turn on, i.e., $2\phi_b$.

In the instance where the threshold voltage for a non zero substrate bias ($V_{sx}$) is desired the current must be integrated until it reaches the larger uncovered charge in the silicon body:

$$Qs(\phi + V_{sx})$$

which charge is a function of the surface potential $\phi$ and substrate bias. To uncover this charge the preset surface potential $\phi_{sd}$ is set equal to the surface potential $\phi$ plus the substrate bias $V_{sx}$.

In this case the gate voltage is now $$V_G(to) = V_{FB} + (\phi + V_{sx}) - Qs(\phi + V_{sx})/Co$$

and the threshold voltage for the preset substrate bias $V_{sx}$ is given by $$V_T(V_{sx}) = V_{FB} + \phi - Qs(\phi + V_{sx})/Co = V_G(to) - V_{sx}$$

In this way the threshold voltage at any substrate bias can be measured. Thus, the threshold parameter for a four terminal device is measured on a two terminal device.

In the case where 13 ohm-cm p type silicon material is used for the body 10 the $\phi = 0.588$ V and where the substrate voltage desired is $=2.2$ V then the preset voltage 23 and the comparator is set at 2.788 volts.

By measuring threshold voltages for different substrate voltages a substrate sensitivity curve as shown in FIG. 4 can be realized. The described circuit thus teaches a method of measuring the actual surface potential of any particular semiconductor device and the gate voltage needed to achieve that surface potential. The circuit further permits the rapid ready measurement of the threshold voltage of any particular device at any substrate bias without requiring any assumption about turn on current characteristics of the device. The invention further teaches that the substrate sensitivity curve of a device can be generated at any time during processing of the device and that the channel doping level of the device can be measured at any time during the process by the expedience of placing a single electrode on the surface of the device being measured. Additionally, a substrate sensitivity curve can be obtained and therefore can determine the influence of any particular process step on the channel doping of a device.

At the time the comparator circuit 22 holds the ramp voltage the threshold voltage at a preset substrate voltage can be measured. This is accomplished by coupling the voltage on the electrode 12 to a summing circuit 51 into which a voltage equal to the $V_{sx}$ is also applied from a voltage source 52. The output 53 of this summing circuit is fed into a sample and hold circuit 54 which is turned on by a trigger pulse via line 55 from capacitor circuit 22. When the sample and hold circuit turns on the output 56 is the threshold voltage of the device at the preselected substrate voltage $V_{sx}$.

While the invention has been particularly shown and described with reference to a preferred embodiment thereof, it will now be understood by those skilled in the art that various changes in form and details of the apparatus and method may be made therein without departing from the spirit and scope of the invention and that the method in no way is restricted by the apparatus.

What is claimed is:

1. An apparatus for measuring, in a metal insulator semiconductor structure, the surface potential and the impurity concentration in the semiconductor comprising;
  means for measuring the flat band voltage of the structure,
  means for measuring the capacitance of the insulator of the structure,
  ramp voltage means for selectively biasing the semiconductor above the flat band voltage of the structure to deplete the semiconductor of mobile charges and effect a change in surface potential on the semiconductor,
  integrator means coupled to the semiconductor for monitoring the impurity concentration in the semiconductor, and
  summing means coupled to the output of the integrator means and to the ramp voltage of impurity concentration in the semiconductor into a measurement of the surface potential in the semiconductor.

2. The apparatus of claim 1 wherein there is further provided a comparator means connected between said output of said integrator means and the ramp voltage means to hold the ramp voltage means at a voltage at which the surface potential meets a preselected level.

3. The apparatus of claim 1 wherein said integrator means comprises a charge detector circuit and a scaler circuit.

4. The apparatus of claim 1 wherein said ramp voltage means has a ramp rate of approximately 1000 volts per second.

5. The apparatus of claim 3 wherein said scaler circuit provides a voltage output directly proportional to the charges uncovered in said semiconductor by depletion of said semiconductor of said mobile charges and inversely proportional to the capacitance of the insulator of said structure.

6. The apparatus of claim 3 wherein said charge detector circuit comprises an operational amplifier having a capacitance feedback between its negative input and its output and its positive input is at ground.

7. An apparatus for measuring in a metal insulator semiconductor structure, the surface potential and the impurity concentration in the semiconductor body comprising;
   a first voltage source providing a DC voltage,
   a second voltage source providing a ramp voltage,
   a first summing circuit coupled to both of said voltage sources and to said metal on said structure for summing said voltage and impressing said voltages across said insulator to cause current to flow in said structure,
   a charge measuring circuit coupled to said body for measuring the current flowing in said structure,
   a capacitance measurement circuit connected to said charge measuring circuit for measuring the capacitance of the insulator of said metal insulator semiconductor structures,
   a capacitor having a known value coupled across said charge measuring circuit,
   a flat band measuring circuit connected to said capacitance measuring circuit,
   a scaler circuit connected to the output of said charge measuring circuit for providing an output voltage proportional to the ratio of the capacitance of the insulator to the capacitor of known value,
   a second summing circuit connected to the output of said ramp voltage source and the output of said scaler circuit for summing the output of the ramp voltage source and the output of said scaler circuit to provide a measurement of the surface potential in the semiconductor body, and
   comparator means coupled to the output of said second summing circuit and said ramp voltage source to hold said ramp voltage at its instantaneous voltage when said measured surface potential matches a predetermined value.

* * * * *

UNITED STATES PATENT AND TRADEMARK OFFICE
CERTIFICATE OF CORRECTION

PATENT NO. : 4,325,025
DATED : April 13, 1982
INVENTOR(S) : Richard A. Corcoran et al It is certified that error appears in the above-identified patent and that said Letters Patent are hereby corrected as shown below:

Column 9, line 13, change "$\phi=2\phi_b=2(kT/q)\ln(Na/ni)$" to -- $\phi_{sd}=2\phi_b=2(kT/q)\ln(Na/ni)$ --.

Column 9, line 23, change "$\phi=0.588$ volts" to -- $\phi_{sd}=0.588$ volts --.

Column 9, line 34, change $\phi_{sd}(to)=V_R(to)+(Qs/Co)(to)$ to -- $\phi_{sd}(to)=V_R(to)+(Qs(to)/Co)$ --.

Column 9, line 35, change "$V_G(to)=V_{FB}+\phi_{sd}(-Qs/Co)(to)$ to -- $V_G(to)=V_{FB}+\phi_{sd}(-Qs(to)/Co)$ --.

Signed and Sealed this

Thirtieth Day of April 1985

[SEAL]

Attest:

DONALD J. QUIGG

Attesting Officer    Acting Commissioner of Patents and Trademarks